United States Patent
Yamamoto

(10) Patent No.: US 6,842,064 B2
(45) Date of Patent: Jan. 11, 2005

(54) OVERCURRENT PROTECTION AND MASKING CIRCUITRY FOR PROTECTION AGAINST AN OVERCURRENT CONDITION

(75) Inventor: Akihisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/652,072

(22) Filed: Sep. 2, 2003

(65) Prior Publication Data

US 2004/0201935 A1 Oct. 14, 2004

(30) Foreign Application Priority Data

Apr. 9, 2003  (JP) ........................................ 2003-105245

(51) Int. Cl.[7] .............................................. H03K 17/60
(52) U.S. Cl. ...................... 327/480; 327/419; 361/93.1; 323/276
(58) Field of Search .......................... 327/419, 423–427, 327/434, 432, 387–389, 480; 361/88–90, 94, 87, 101, 66, 93.1, 93.4; 323/273–276

(56) References Cited

U.S. PATENT DOCUMENTS 5,325,258 A * 6/1994 Choi et al. ..................... 361/87
5,375,029 A * 12/1994 Fukunaga et al. ........... 361/101
5,396,117 A * 3/1995 Housen et al. ............... 327/480
5,444,595 A * 8/1995 Ishikawa et al. .............. 361/86
5,710,508 A * 1/1998 Watanabe .................... 323/284
6,717,785 B2 * 4/2004 Fukuda et al. .............. 361/93.1

* cited by examiner

Primary Examiner—Minh Nguyen
(74) Attorney, Agent, or Firm—Oblon, Spivak, McClelland, Maier & Neustadt, P.C.

(57) ABSTRACT

An overcurrent protection circuit (6) outputs an overcurrent protection signal (S6) based on a sense voltage ($V_{sense}$). A masking circuit (5) is configured so as to allow a masking signal (S5) to be kept set to "L" even when an input signal (IN) rises to "H" (an IGBT (1) is turned on) and an NPN bipolar transistor (23) is turned off, and allow the masking signal (S5) to be changed only after a capacitor (C12) is charged up and a voltage (V9) exceeds a reference voltage (VR). An AND gate (25) receives the masking signal (S5) at one of input terminals thereof and the overcurrent protection signal (S6) at the other of the input terminals thereof, and provides an output which is then output as an interruption control signal (SC_OUT) from a sense output terminal (P2) and is finally supplied to a gate terminal (P3) of the IGBT (1).

7 Claims, 4 Drawing Sheets

F I G. 2
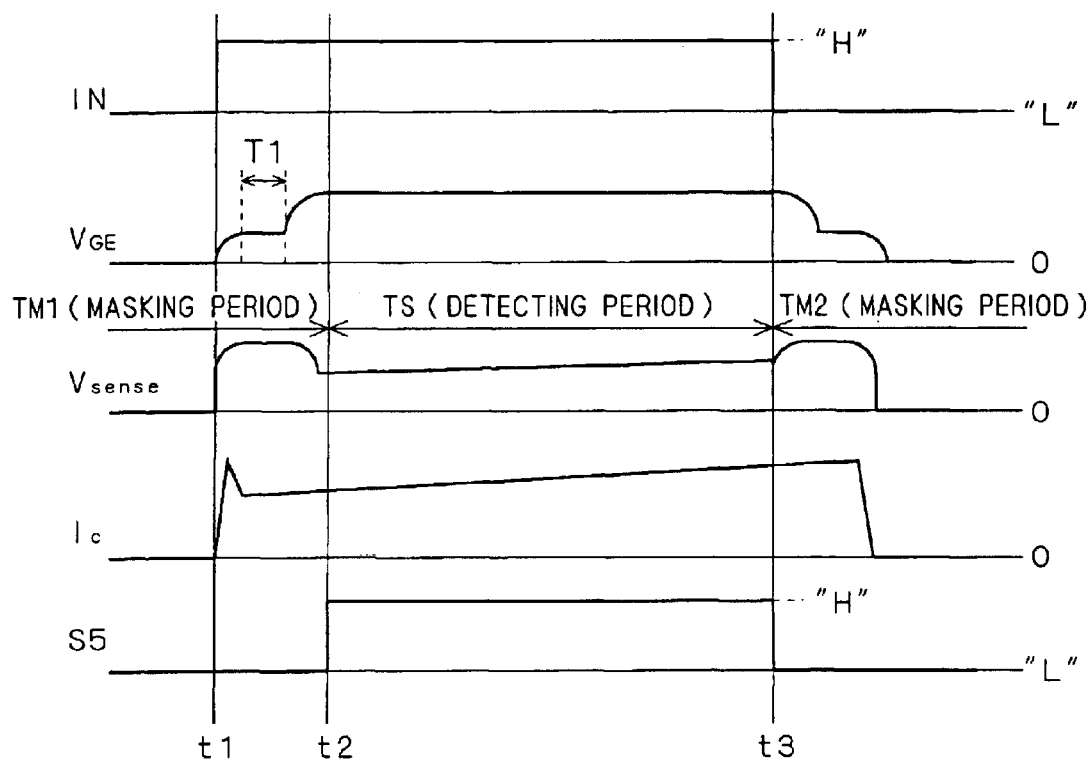

OVERCURRENT PROTECTION AND MASKING CIRCUITRY FOR PROTECTION AGAINST AN OVERCURRENT CONDITION

BACKGROUND OF THE INVENTION

1. Field of the Invention

The present invention relates to a driving circuit for driving a semiconductor device (semiconductor element) used in a power converter such as an inverter, which functions to protect the semiconductor device against an overcurrent condition.

2. Description of the Background Art

A driving circuit for driving an IGBT which is one example of a high power semiconductor device often has an "overcurrent protecting function", i.e., functions to protect the IGBT against an overcurrent condition. The overcurrent protecting function is performed as follows. First, an IGBT cell is divided into a main terminal and a sense terminal. A sense current obtained from the sense terminal is converted into a voltage by a current detecting resistor, as a sense voltage. The sense voltage is monitored, thereby to detect an overcurrent condition in which a main current excessively flows through the main terminal of the IGBT. Then, upon detection of the overcurrent condition based on the sense current, the driving circuit interrupts current flow to the IGBT.

The above-described method for detecting an overcurrent condition based on the sense current (sense voltage), however, has a disadvantage. According to the above-described method, the sense voltage and the main current are in inappropriate proportion to each other during a period immediately after a turn-on or a turn-off of the IGBT, which makes it impossible to accurately detect an overcurrent condition in which the main current excessively flows.

Such inappropriate proportion between the sense voltage and the main current occurs due to imbalance between the main terminal and the sense terminal of the IGBT with respect to relationship between a collector-emitter voltage $V_{CE}$ and a gate-emitter voltage $V_{GE}$. Such imbalance is observed during a period immediately after a turn-off or a turn-on of the IGBT, and the degree of the imbalance is particularly great during a "Miller period" (a period of discharge/charge of a feedback capacitor between a collector and a gate). This disadvantage is recognized by simulation carried out using an equivalent circuit of the driving circuit for the IGBT.

To overcome the foregoing disadvantage, a conventional overcurrent protection circuit is provided with a filter or a delay circuit having a sufficiently large time constant, to function to shape a waveform (including a delay) so as to prevent an overcurrent condition from being erroneously detected during a predetermined period immediately after a turn-off or a turn-on.

Another conventional overcurrent protection circuit functioning to shape such a waveform is disclosed in Japanese Patent Application Laid-Open No. 2001-345688, for example. An overcurrent protection circuit disclosed in this reference includes a delay circuit for generating a delay time in giving a result of comparison of a sense voltage with a reference voltage, thereby to prevent current flow to an IGBT from being erroneously interrupted due to variation in a sense current which is caused by a noise, to avoid occurrence of malfunction.

However, the conventional overcurrent protection circuits which function to shape an appropriate waveform as described above require an external component (R, C or the like) for forming a waveform-shaping filter having a sufficiently large time constant, or the like. This makes integration difficult.

Also an RTC (Real Time Control) circuit (a circuit for interrupting current flow to an IGBT at an instant when a short-circuit current flows into the IGBT) is further required in order to compensate for operational delay which is caused by delaying a sense voltage (sense current). This makes integration more difficult.

SUMMARY OF THE INVENTION

It is an object of the present invention to obtain a driving circuit for driving a semiconductor device, which is capable of protecting the semiconductor device against an overcurrent condition while avoiding malfunction during a period immediately after a turn-on or a turn-off of the semiconductor device, without reducing an integration density.

The present invention is intended for a driving circuit for driving a semiconductor device which is driven based on a signal supplied to a gate terminal and includes a main electrode for providing an output and a sense electrode. The driving circuit includes an overcurrent protection circuit and an overcurrent protection signal masking part. The overcurrent protection circuit detects occurrence or non-occurrence of an overcurrent condition of the semiconductor device based on a sense voltage obtained from the sense electrode, and outputs an overcurrent protection signal which instructs the semiconductor device to stop operating when an overcurrent condition is detected. The overcurrent protection signal masking part establishes a masking period including at least a predetermined period immediately after a turn-on and a turn-off of the semiconductor device, and invalidates the overcurrent protection signal in the masking period while validating the overcurrent protection signal in other periods than the masking period to supply the overcurrent protection signal to the gate terminal of the semiconductor device.

Because of inclusion of the overcurrent protection signal masking part, it is possible to surely prevent operations for protecting the semiconductor device against an overcurrent condition from being carried out based on the sense voltage which is unstable immediately after a turn-on/turn-off of the semiconductor device, to avoid malfunction. Also, the overcurrent protection circuit does not require a filtering circuit or the like for shaping a waveform of the sense voltage which is unstable immediately after a turn-on/turn-off of the semiconductor device, which provides for increase in integration density.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a timing chart illustrating overcurrent protecting operations according to the first preferred embodiment.

DESCRIPTION OF THE PREFERRED EMBODIMENTS

First Preferred Embodiment

Figure 1:
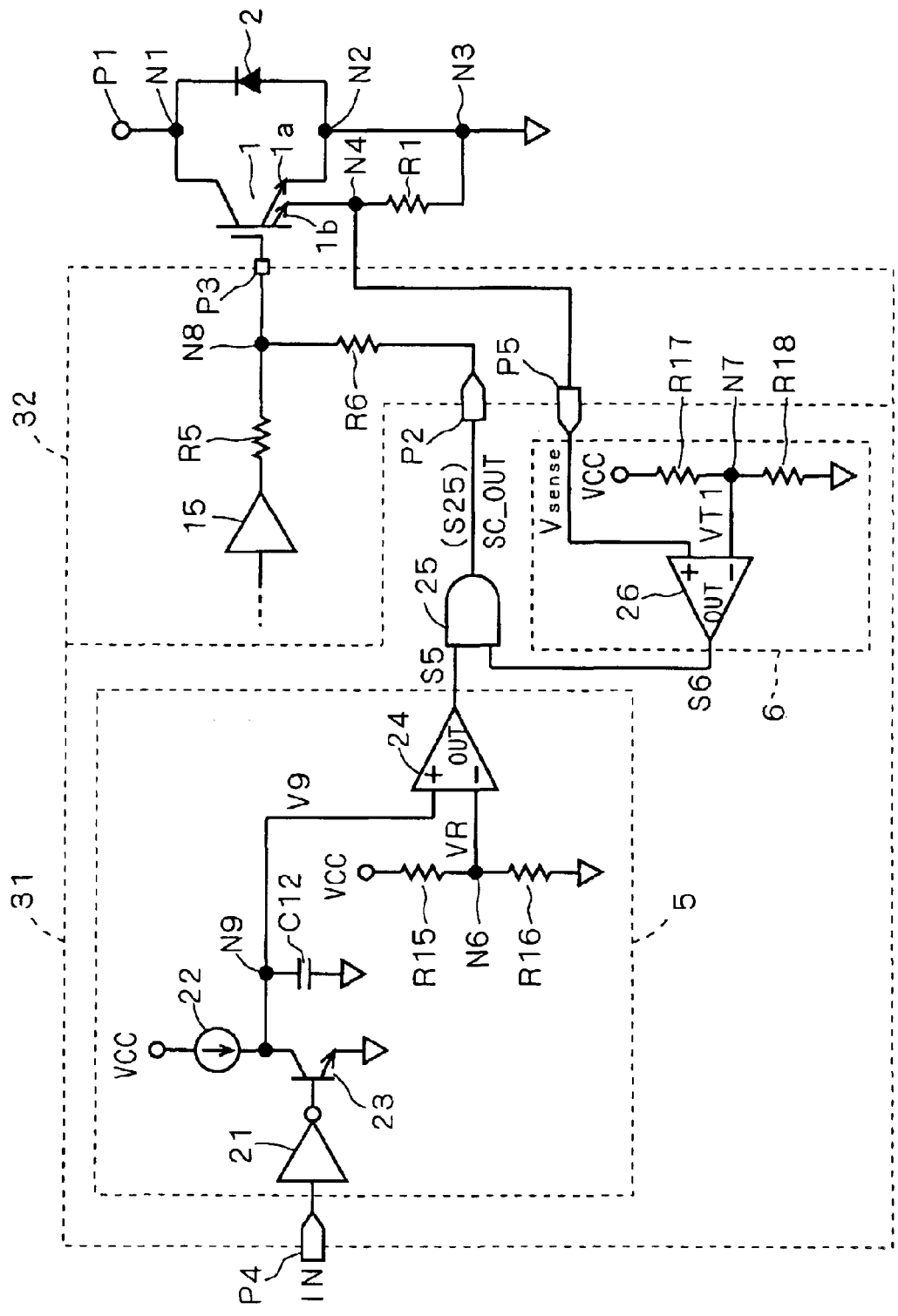
FIG. 1 is a circuit diagram illustrating a part of a driving circuit for an IGBT according to a first preferred embodiment of the present invention.

FIG. 1 is a circuit diagram illustrating a part of a driving circuit for an IGBT according to a first preferred embodiment of the present invention.

Referring to FIG. 1, a collector terminal P1 is connected via a node N1 to a collector of an IGBT 1 which is a semiconductor device to be driven. The IGBT 1 includes a main terminal 1a and a sense terminal 1b each as an emitter electrode. The main terminal 1a is connected to ground via nodes N2 and N3, and the sense terminal 1b is connected to a node N4.

A gate terminal P3 is electrically connected to a gate electrode of the IGBT 1, and receives an output of a driver 15 which serves as a drive signal, via a resistor R5 and a node N8. The gate terminal P3 is driven in response to an output of the driver 15, in a normal operating condition. Further, a feedback diode 2 is provided between the nodes N1 and N2 with an anode of the diode 2 being located closer to the node N2.

Further, a shunt resistor R1 is provided between the nodes N3 and N4. The node N4 is connected to a sense input terminal P5, and a voltage obtained from the sense input terminal P5 is a sense voltage $V_{sense}$.

An overcurrent protection circuit 6 includes a comparator 26 and resistors R17 and R18. The resistors R17 and R18 are connected in series with each other between a power supply VCC and ground. A resistance ratio of the resistors R17 and R18 governs a detection threshold voltage VT1 (approximately 0.5V) which is a threshold voltage used for detection to be provided from the node N7.

The comparator 26 receives the sense voltage $V_{sense}$ at a positive input terminal thereof while receiving the detection threshold voltage VT1 at a negative input terminal thereof, and compares the sense voltage $V_{sense}$ and the detection threshold voltage VT1 with each other, to output an overcurrent protection signal S6 based on a result of the comparison. The overcurrent protection signal S6 which is set to "H" is output when the sense voltage $V_{sense}$ is higher than the detection threshold voltage VT1, while the overcurrent protection signal S6 which is set to "L" is output when the sense voltage $V_{sense}$ is lower than the detection threshold voltage VT1.

A masking circuit 5 receives an input signal IN from an input terminal P4. For the input signal IN, any signal corresponding to a drive-related signal can be used. The "drive-related signal" includes the drive signal and a signal which rises and falls in synchronization with a timing of a turn-on/turn-off of the IGBT 1. An input signal to the driver 15 can be used as the input signal IN, for example.

The masking circuit 5 includes an inverter 21, a current source 22, an NPN bipolar transistor 23, a comparator 24 and resistors R15 and R16. The inverter 21 receives the input signal IN via an input terminal P4, and provides an output to a base of the NPN bipolar transistor 23.

The (constant) current source 22 is provided between a collector of the NPN bipolar transistor 23 and the power supply VCC. An emitter of the NPN bipolar transistor 23 is connected to ground.

Further, a capacitor C12 is interposed between the collector of the NPN bipolar transistor 23 and ground, and a voltage obtained from a node N9 which is connected to one of electrodes of the capacitor C12 is a voltage V9.

The resistors R15 and R16 are connected in series with each other between the power supply VCC and ground, and a voltage obtained from a node N6 connected between the resistors R15 and R16 is a reference voltage VR.

The comparator 24 receives the voltage V9 at a positive input terminal thereof while receiving the reference voltage VR at a negative input terminal thereof, to compare those voltages with each other. Then, the comparator 24 outputs a masking signal S5 based on a result of the comparison. The masking signal S5 which is set to "H" is output when the voltage V9 is higher than the reference voltage VR(V9>VR), while the masking signal S5 which is set to "L" is output when the voltage V9 is lower than the reference voltage VR(V9<VR).

An AND gate 25 is further provided, to receive the masking signal S5 from the comparator 24 at one of input terminals thereof while receiving the overcurrent protection signal S6 from the overcurrent protection circuit 6 at the other of the input terminals thereof. The AND gate 25 generates an output signal S25, which is then output from a sense output terminal P2, as an interruption control signal SC_OUT. The interruption control signal SC_OUT is supplied to the gate terminal P3 of the IGBT 1 via the resistor R6 and the node N5.

FIG. 2 is a timing chart illustrating operations for protecting the IGBT against an overcurrent condition ("overcurrent protecting operations") according to the first preferred embodiment. In FIG. 2, "$V_{GE}$" denotes a gate-emitter voltage which is a voltage between the main terminal 1a and the gate electrode of the IGBT 1, and "$I_c$" denotes a collector current of the IGBT 1.

Referring to FIG. 2, prior to a time t1, the input signal IN is set to "L" so that the NPN bipolar transistor 23 is in an on-state and the capacitor C12 is discharged. Also, the masking signal S5 is set to "L" (which requests a masking period to occur), and thus a masking period TM1 is occurring.

At the time t1, the input signal IN rises from "L" to "H" (the IGBT 1 is turned on). Then, in a period immediately after the time t1 which includes a Miller period T1, both the gate-emitter voltage $V_{GE}$ and the sense voltage $V_{sense}$ are unstable as illustrated in FIG. 2. As such, a ratio between a current provided from the main terminal 1a and a current provided from the sense terminal 1b in the IGBT 1 is significantly different from that in a normal operating condition. Thus, a value of the sense voltage $V_{sense}$ as detected is not accurate.

The masking signal S5 output from the comparator 24 is not changed from "L" to "H" when the input signal IN is set to "H" and the NPN bipolar transistor 23 is turned off. The masking signal S5 is kept being set to "L" and the masking period TM1 continues until the capacitor Cl2 is charged up and the voltage V9 exceeds the reference voltage VR. Accordingly, the overcurrent protection signal S6 output from the overcurrent protection circuit 6 is invalidated by the AND gate 25, so that the interruption control signal SC_OUT is set to "L". As such, the masking circuit 5 and the AND gate 25 function as an overcurrent protection signal masking part for masking the overcurrent protection signal S6.

Thereafter, when the voltage V9 exceeds the reference voltage VR at a time t2, the masking signal S5 is set to "H" and the masking period TM1 is replaced by a detecting period TS. As a result, the overcurrent protection signal S6 output from the overcurrent protection circuit 6 is validated and is output as the interruption control signal SC_OUT.

As described above, even when the input signal IN is set to "H" and operations for turning the IGBT 1 on are initiated, the masking period TM1 continues during a period immediately after the time t1 until the time t2.

The overcurrent protection signal S6 is kept being invalidated during the masking period TM1 which continues from the time t1 to the time t2, even when the IGBT 1 is turned on at the time t1. This makes it possible to surely prevent the overcurrent protecting operations from being erroneously carried out based on the sense voltage $V_{sense}$ which is unstable immediately after a turn-on of the IGBT 1.

Then, when the input signal IN falls to "L" at a time t3, the NPN bipolar transistor 23 is turned on. Also, the voltage V9 comes below the reference voltage VR and the masking signal S5 falls to "L". In this regard, by configuring the NPN bipolar transistor 23 to have a sufficiently enhanced drivability, it is possible to allow the masking signal S5 to fall almost simultaneously with the fall of the input signal IN.

The detecting period TS is replaced by a masking period TM2 at the time 3, so that the overcurrent protection signal S6 output from the overcurrent protection circuit 6 is again invalidated. Then, the interruption control signal SC_OUT is set to "L".

As described above, the masking period TM2 commences so that the overcurrent protection signal S6 is invalidated, immediately after the time t3 at which the input signal IN is again set to "L" and operations for turning IGBT off are initiated. This makes it possible to surely prevent the overcurrent protecting operations from being erroneously carried out based on the sense voltage $V_{sense}$ which is unstable immediately after a turn-off of the IGBT 1.

A length of the masking period TM1 immediately after a turn-on of the IGBT and a timing at which the masking period TM2 commences immediately after a turn-off of the IGBT 1 are determined based on the input signal IN (the drive-related signal) which rises and falls in synchronization with a timing of a turn-on/turn-off of the IGBT. Hence, correct determination can be made.

Figure 4:
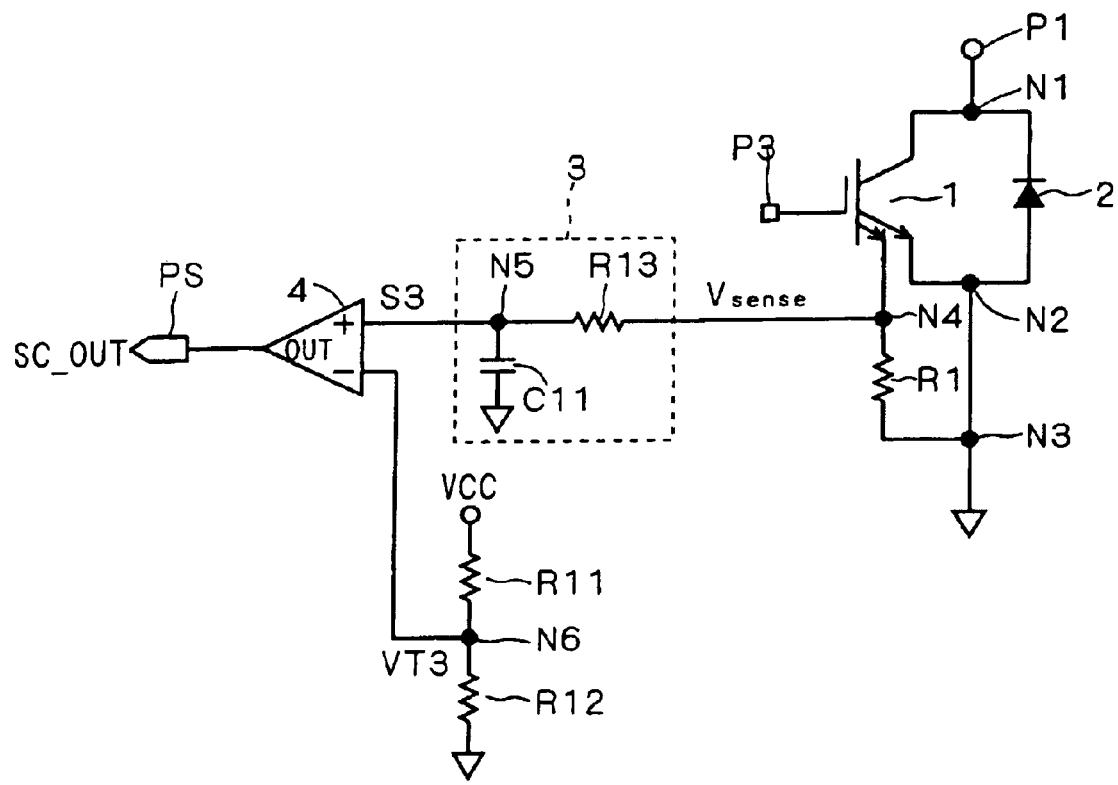
FIG. 4 is a circuit diagram illustrating a typical overcurrent protection circuit.

FIG. 4 is a circuit diagram illustrating a typical overcurrent protection circuit in a driving circuit for an IGBT. As illustrated in FIG. 4, a sense voltage $V_{sense}$ is supplied to a positive input terminal of a comparator 4 via a filtering circuit 3. The filtering circuit 3 includes a capacitor C11 and a resistor R13. The resistor R13 is provided between a node N4 and a node N5 which is the positive input terminal of the comparator 4. The capacitor C11 is provided between the node N5 and ground.

The filtering circuit 3 having the foregoing configuration filters the sense voltage $V_{sense}$ using an RC time constant determined by the resistor R13 and the capacitor C11, and supplies the filtered sense voltage $V_{sense}$ as a signal S3 to the positive input terminal of the comparator 4. It is noted that the capacitor C11 and the resistor R13 should be formed so as to be relatively large in size in order to accomplish a large RC time constant. Accordingly, it is difficult to integrate the capacitor C11 and the resistor R13 with other components into a single device, and thus the capacitor C11 and the resistor R13 are provided external to the other integrated components in most cases.

Further, resistors R11 and R12 are connected in series with each other between a power supply VCC and ground. A voltage provided from a node N7 between the resistors R11 and R12 is a detection threshold voltage VT3 which is a threshold voltage used for detection.

The comparator 4 receives the signal S3 and the detection threshold voltage VT3 at a positive input terminal thereof and a negative input terminal thereof, respectively, and outputs an overcurrent protection signal S4 from a sense output terminal P5. The overcurrent protection signal S4 which is set to "H" is output when the signal S3 is higher than the detection threshold voltage VT3 (S3>VT3), while the overcurrent protection signal S4 which is set to "L" is output when the signal S3 is lower than the detection threshold voltage VT3 (S3<VT3). The overcurrent protection signal S4 is finally supplied to the gate terminal P3 of the IGBT 1 (such operation is not illustrated). The IGBT 1 and peripheral components are identical to those according to the first preferred embodiment which are illustrated in FIG. 1, and thus detailed description therefor is omitted.

As illustrated in FIG. 4, the typical overcurrent protection circuit is provided with the filtering circuit 3 having a large time constant which is connected to a side of the comparator 4 on which the input terminal is provided, in order to remedy instability of the sense voltage $V_{sense}$ which is observed immediately after a turn-on/turn-off of the IGBT 1. However, the provision of the filtering circuit 3 significantly reduces integration density.

In contrast, the driving circuit for an IGBT according to the first preferred embodiment does not require a component like the filtering circuit 3 (a component having a large size such as R or C is not necessary), which provides for significant increase in integration density.

Thus, in the first preferred embodiment, when a semiconductor device to be driven such as the IGBT 1 has a relatively small capacity, all components within an integration area 32 including the driver 15, the resistors R5 and R6, the masking circuit 5 and the overcurrent protection circuit 6 can be more easily integrated than in the conventional art. Also, even when a semiconductor device to be driven has a relatively large capacity, all components within an integration area 31 including the AND gate 25, the masking circuit 5 and the overcurrent protection circuit 6 can be more easily integrated in the first preferred embodiment than in the conventional art.

Moreover, the driving circuit for an IGBT according to the first preferred embodiment, an operation for shaping a waveform of the sense voltage $V_{sense}$ which is carried out by the filtering circuit 3 in the typical overcurrent protection circuit is not carried out. Accordingly, accuracy in detecting an overcurrent condition based on the sense voltage $V_{sense}$ is increased.

Second Preferred Embodiment

Figure 3:
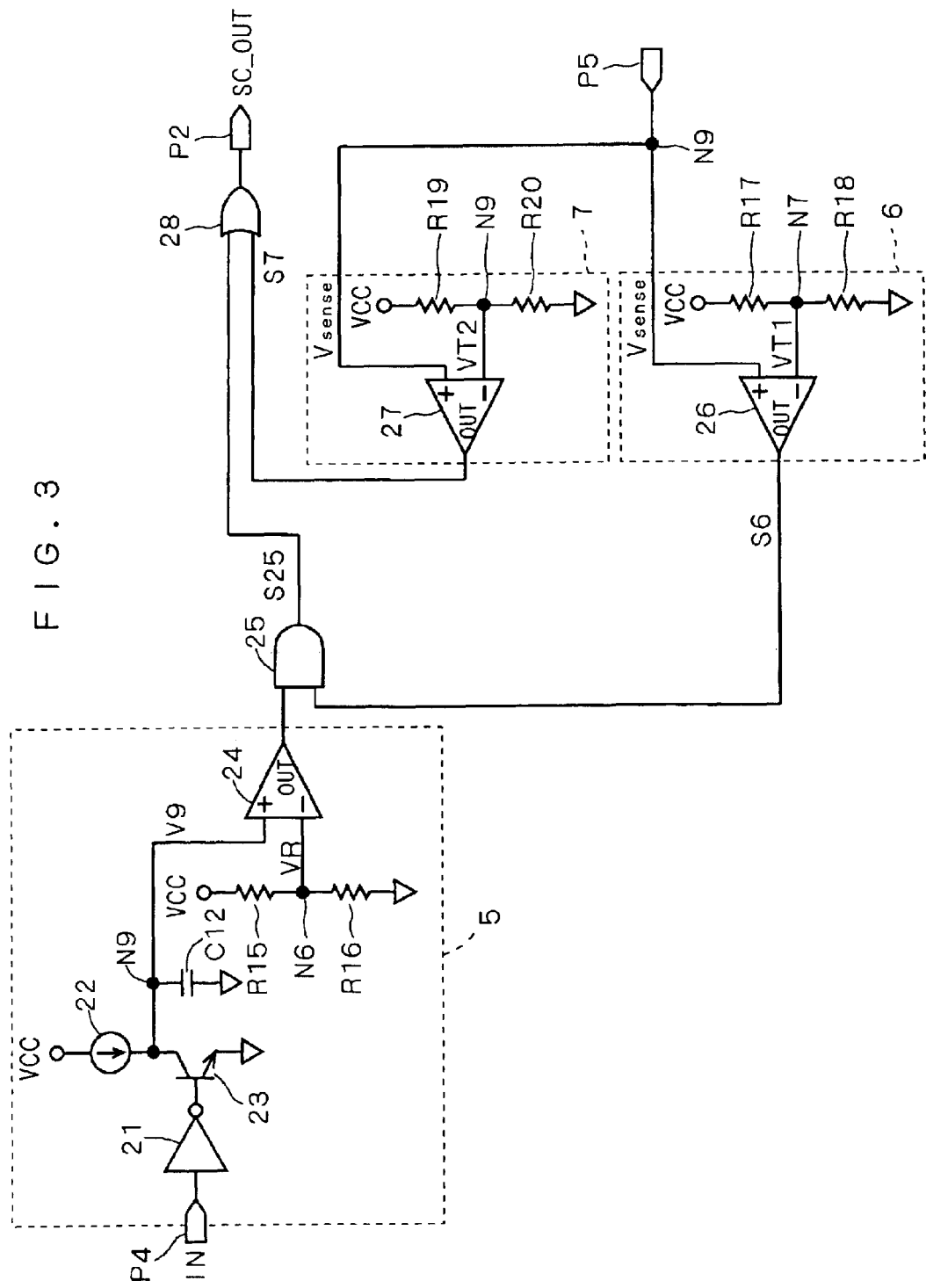
FIG. 3 is a circuit diagram illustrating a part of a driving circuit for an IGBT according to a second preferred embodiment of the present invention.

FIG. 3 is a circuit diagram illustrating a part of a driving circuit for an IGBT according to a second preferred embodiment of the present invention. As illustrated in FIG. 2, the driving circuit according to the second preferred embodiment differs from the driving circuit according to the first preferred embodiment in that a short-circuit protection circuit 7 and an OR gate 28 are additionally provided.

The short-circuit protection circuit 7 includes a comparator 27 and resistors R9 and R20. The resistors R19 and 20 are connected in series with each other between a power supply VCC and ground. A resistance ratio of the resistors R19 and R20 governs a detection threshold voltage VT2 which is a threshold voltage used for detection to be provided from the node N9.

The detection threshold voltage VT2 of the short-circuit protection circuit 7 is determined to be relatively high, approximately 2V. In contrast thereto, the detection threshold voltage VT1 of the overcurrent protection circuit 6 is determined to be relatively low, approximately 0.5V, as described above.

The comparator 27 receives the sense voltage $V_{sense}$ at a positive input terminal thereof and the detection threshold voltage VT2 at a negative input terminal thereof, and outputs a short-circuit protection signal S7.

The OR gate 28 receives the output signal S25 supplied from the AND gate 25 at one of input terminals thereof and the short-circuit protection signal S7 at the other of the input terminals thereof, and provides an output which is then output as the interruption control signal SC_OUT. The driving circuit according to the second preferred embodiment is identical to the driving circuit according to the first preferred embodiment with respect to the other structural features. The driving circuit according to the second preferred embodiment includes the other components not illustrated in FIG. 3 such as the IGBT 1 and the driver 15, of course, in the same manner as the driving circuit according to the first preferred embodiment.

In the first preferred embodiment, the masking period TM1 or TM2 is a non-sensing period during which detection of an overcurrent condition based on the sense voltage $V_{sense}$ is not carried out by the overcurrent protection circuit 6 as illustrated in FIG. 2. As such, operations for canceling an overcurrent condition occurring during the masking period TM1 or TM2 (specifically, shutting off a gate) are initiated after expiration of the masking period TM1 or TM2 at the earliest. This may cause a delay in protecting the IGBT 1 against an overcurrent condition. The second preferred embodiment provides for such a situation.

The short-circuit protection signal S7 is output via the OR gate 28, as the interruption control signal SC_OUT, and is not masked even in the masking period TM1 or TM2. Accordingly, even in the masking period TM1 or TM2 immediately after a turn-on/turn-off of the IGBT 1, the short-circuit protection signal S7 is changed to "H" if the sense voltage $V_{sense}$ exceeds the detection threshold voltage VT2, so that the IGBT 1 can be protected based on the interruption control signal SC_OUT.

The sense voltage $V_{sense}$ provided immediately after a turn-on/turn-off depends on the main current, i.e., the collector current $I_c$, and thus is likely to have a relatively high value. In view of this respect, the detection threshold voltage VT2 of the short-circuit protection circuit 7 is determined to be relatively high, as described above.

Additionally, as the sense voltage $V_{sense}$ provided immediately after a turn-on/turn-off is unstable, a value of the sense voltage $V_{sense}$ as provided may not be so highly accurate as described above, but is accurate enough to be used for protecting an IGBT against a short-circuit condition in which a considerably excessive current such as an arm short-circuit current (a current greatly exceeding a rated current) flows.

Further, as a result of determining the detection threshold voltage VT2 to be relatively high (VT2>VT1) in the short-circuit protection circuit 7, the filtering circuit 3 as illustrated in FIG. 4 is not required. Also, a signal propagation delay time necessary for protecting the IGBT 1 can be kept substantially identical to that in a general integrated circuit. Accordingly, it is possible to protect the IGBT 1 very quickly within 1 μs from a time of detecting a short-circuit condition based on the sense voltage $V_{sense}$.

It is noted that a saturation voltage of the IGBT 1 is approximately 1.5V under a rated current. A sum of a saturation voltage of the sense terminal 1b of the IGBT 1 and the sense voltage $V_{sense}$ (a voltage generated by the shunt resistor R1 as a current detecting resistor) corresponds to a saturation voltage of the main terminal 1a of the IGBT 1. Accordingly, the sense voltage $V_{sense}$ detected under a rated current in a normal operating condition does not exceed 1V at maximum.

Thus, an overcurrent condition (in which $V_{sense}$ is higher than V2) is not detected in a normal operating condition by the short-circuit protection circuit 7 because the detection threshold voltage VT2 is determined to be higher than the saturation voltage of the IGBT 1. Hence, it is not necessary to establish a masking period during which a signal is actually masked, for the short-circuit protection circuit 7, unlike the overcurrent protection circuit 6.

As is made clear from the foregoing, the driving circuit for an IGBT according to the second preferred embodiment includes the short-circuit protection circuit 7, which produces a further advantage of surely protecting an IGBT against a short-circuit condition possibly occurring immediately after a turn-on/turn-off, in addition to the same advantages as produced by the driving circuit according to the first preferred embodiment.

Further, in the second preferred embodiment, similarly to the first preferred embodiment, when a semiconductor device to be driven such as the IGBT 1 has a relatively small capacity, all components within an integration area including the driver 15, the resistors R5 and R6, the masking circuit 5, the overcurrent protection circuit 6, the short-circuit protection circuit 7 and the OR gate 28 can be more easily integrated than in the conventional art. Also, even when a semiconductor device to be driven has a relatively large capacity, all components within an integration area including the AND gate 25, the masking circuit 5, the overcurrent protection circuit 6, the OR gate 28 and the short-circuit protection circuit 7 can be more easily integrated in the second preferred embodiment than in the conventional art.

While the invention has been shown and described in detail, the foregoing description is in all aspects illustrative and not restrictive. It is therefore understood that numerous modifications and variations can be devised without departing from the scope of the invention.

What is claimed is:

1. A driving circuit which drives a semiconductor device based on a control signal supplied to a gate terminal, said driving circuit comprising:

an overcurrent protection circuit configured to detect an overcurrent condition of said semiconductor device based on a sense voltage obtained from a sense electrode, and outputting an overcurrent protection signal to said gate terminal to instruct said semiconductor device to stop operating when an overcurrent condition is detected;

an overcurrent protection signal masking part configured to output a masking signal invalidating said overcurrent protection signal during a masking period after a turn on and a turn off of said semiconductor device, and validating said overcurrent protection signal during periods other than said masking period; and a control element configured to receive said masking signal and said overcurrent protection signal and configured to output said control signal.

2. The driving circuit according to claim 1, further comprising a short-circuit protection circuit for detecting occurrence or non-occurrence of a short-circuit condition of said semiconductor device based on said sense voltage, and supplying a short-circuit protection signal which instructs said semiconductor device to stop operating when a short-circuit condition is detected, to said gate terminal of said semiconductor device.

3. The driving circuit according to claim 2, wherein
said overcurrent protection circuit detects that said semiconductor device is under an overcurrent condition when said sense voltage is higher than a first detection threshold voltage, said short-circuit protection circuit detects that said semiconductor device is under a short-circuit condition when said sense voltage is higher than a second detection threshold voltage, and said second detection threshold voltage is determined to be higher than said first detection threshold voltage.

4. The driving circuit according to claim 1, wherein
said overcurrent protection signal masking part receives a drive-related signal which is synchronized with a signal controlling said semiconductor device so as to be turned on or off, to establish said masking period in response to said drive-related signal.

5. The driving circuit according to claim 1,
wherein said semiconductor device includes an IGBT.

6. A driving circuit which drives a semiconductor device based on a control signal supplied to a gate terminal, said driving circuit comprising:

an overcurrent protection circuit configured to detect an overcurrent condition of said semiconductor device based on a sense voltage obtained from a sense electrode, and outputting an overcurrent protection signal to said gate terminal to instruct said semiconductor device to stop operating when an overcurrent condition is detected;

means for outputting a masking signal invalidating said overcurrent protection signal during a masking period after a turn on and a turn off of said semiconductor device, and validating said overcurrent protection signal during periods other than said masking period; and means for receiving said masking signal and said overcurrent protection signal and for outputting said control signal.

7. A driving circuit which drives a semiconductor device based on a control signal supplied to a gate terminal, said driving circuit comprising:

an overcurrent protection circuit configured to detect an overcurrent condition of said semiconductor device based on a sense voltage obtained from a sense electrode, and outputting an overcurrent protection signal to said gate terminal to instruct said semiconductor device to stop operating when an overcurrent condition is detected;

an overcurrent protection signal masking part configured to output a masking signal invalidating said overcurrent protection signal during a masking period after a turn on and a turn off of said semiconductor device, and validating said overcurrent protection signal during periods other than said masking period; and means for receiving said masking signal and said overcurrent protection signal and for outputting said control signal.

* * * * *